US008889559B2

(12) United States Patent
Trapp et al.

(10) Patent No.: US 8,889,559 B2
(45) Date of Patent: *Nov. 18, 2014

(54) METHODS OF FORMING A PATTERN ON A SUBSTRATE

(71) Applicant: Micron Technology, Inc., Boise, ID (US)

(72) Inventors: Shane J. Trapp, Boise, ID (US); Ranjan Khurana, Boise, ID (US); Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/712,830

(22) Filed: Dec. 12, 2012

(65) Prior Publication Data

US 2014/0162459 A1 Jun. 12, 2014

(51) Int. Cl.
*H01L 21/308* (2006.01)
*B44C 1/22* (2006.01)

(52) U.S. Cl.
CPC ........... *H01L 21/308* (2013.01); *Y10S 438/947* (2013.01)
USPC ............. 438/696; 438/694; 438/947; 216/41; 216/58; 216/83

(58) Field of Classification Search
USPC ................. 438/694, 696, 947; 216/41, 58, 83
See application file for complete search history.

(56) References Cited

U.S. PATENT DOCUMENTS

| 5,824,587 A | 10/1998 | Krivokapic |
| 6,362,057 B1 | 3/2002 | Taylor et al. |
| 6,403,431 B1 | 6/2002 | Chung et al. |
| 6,521,543 B2 | 2/2003 | Lien |
| 7,175,944 B2 | 2/2007 | Yin et al. |
| 7,786,015 B2 | 8/2010 | Chen et al. |
| 7,790,360 B2 | 9/2010 | Alapati et al. |
| 7,915,171 B2 | 3/2011 | Wallace et al. |
| 7,981,736 B2 | 7/2011 | Juengling |
| 8,026,172 B2 | 9/2011 | Wang et al. |
| 8,039,399 B2 | 10/2011 | Niroomand et al. |
| 8,080,443 B2 | 12/2011 | Chen et al. |
| 8,211,803 B2 | 7/2012 | Sandhu et al. |
| 8,266,558 B2 | 9/2012 | Wells |
| 2006/0011947 A1 | 1/2006 | Juengling |
| 2006/0134448 A1 | 6/2006 | Daniel et al. |
| 2006/0231900 A1 | 10/2006 | Lee et al. |
| 2007/0281219 A1 | 12/2007 | Sandhu |

(Continued)

FOREIGN PATENT DOCUMENTS

WO WO 2009/126491 10/2009

OTHER PUBLICATIONS

U.S. Appl. No. 13/355,407, filed Jan. 20, 2012, Doebler.
U.S. Appl. No. 13/786,848, filed Mar. 6, 2013, Sipani et al.

(Continued)

*Primary Examiner* — Shamim Ahmed
(74) *Attorney, Agent, or Firm* — Wells St. John, P.S.

(57) ABSTRACT

A method of forming a pattern on a substrate includes forming spaced first material-comprising pillars projecting elevationally outward of first openings formed in second material. Sidewall spacers are formed over sidewalls of the first material-comprising pillars. The sidewall spacers form interstitial spaces laterally outward of the first material-comprising pillars. The interstitial spaces are individually surrounded by longitudinally-contacting sidewall spacers that are over sidewalls of four of the first material-comprising pillars.

27 Claims, 7 Drawing Sheets

(56) References Cited

U.S. PATENT DOCUMENTS

| | | |
|---|---|---|
| 2008/0012056 A1 | 1/2008 | Gonzalez |
| 2008/0113483 A1 | 5/2008 | Wells |
| 2008/0254637 A1 | 10/2008 | Hanson et al. |
| 2008/0280444 A1 | 11/2008 | Jung |
| 2009/0068842 A1 | 3/2009 | Kim |
| 2009/0166723 A1 | 7/2009 | Sung et al. |
| 2010/0167520 A1* | 7/2010 | Chen et al. .................. 438/597 |
| 2010/0170868 A1 | 7/2010 | Lin et al. |
| 2010/0216307 A1 | 8/2010 | Niroomand et al. |
| 2010/0221919 A1 | 9/2010 | Lee et al. |
| 2010/0240221 A1 | 9/2010 | Kim et al. |
| 2010/0258966 A1* | 10/2010 | Sandhu ....................... 264/104 |
| 2011/0117719 A1 | 5/2011 | Brown et al. |
| 2011/0163420 A1 | 7/2011 | Valdivia et al. |
| 2011/0183269 A1 | 7/2011 | Zhu |
| 2011/0312184 A1 | 12/2011 | Lee et al. |
| 2012/0028476 A1 | 2/2012 | Li et al. |
| 2012/0273131 A1* | 11/2012 | Wells ......................... 156/345.3 |
| 2012/0312151 A1 | 12/2012 | Patel |
| 2012/0313151 A1 | 12/2012 | Lee |
| 2013/0295772 A1 | 11/2013 | Kim et al. |

OTHER PUBLICATIONS

U.S. Appl. No. 13/712,806, filed Dec. 12, 2012, Sipani et al.
U.S. Appl. No. 13/712,820, filed Dec. 12, 2012, Khurana et al.
Chapter 2: Crystal Structures and Symmetry; Laue, B; Dec. 28, 2001; 4pp.

* cited by examiner

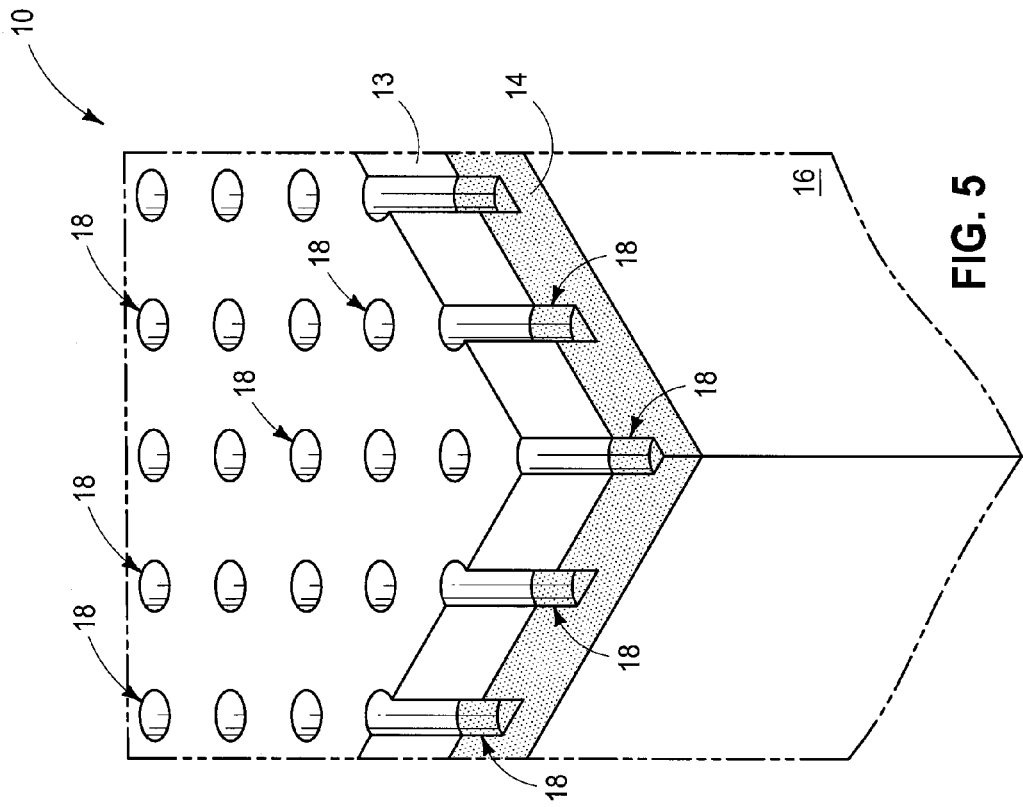
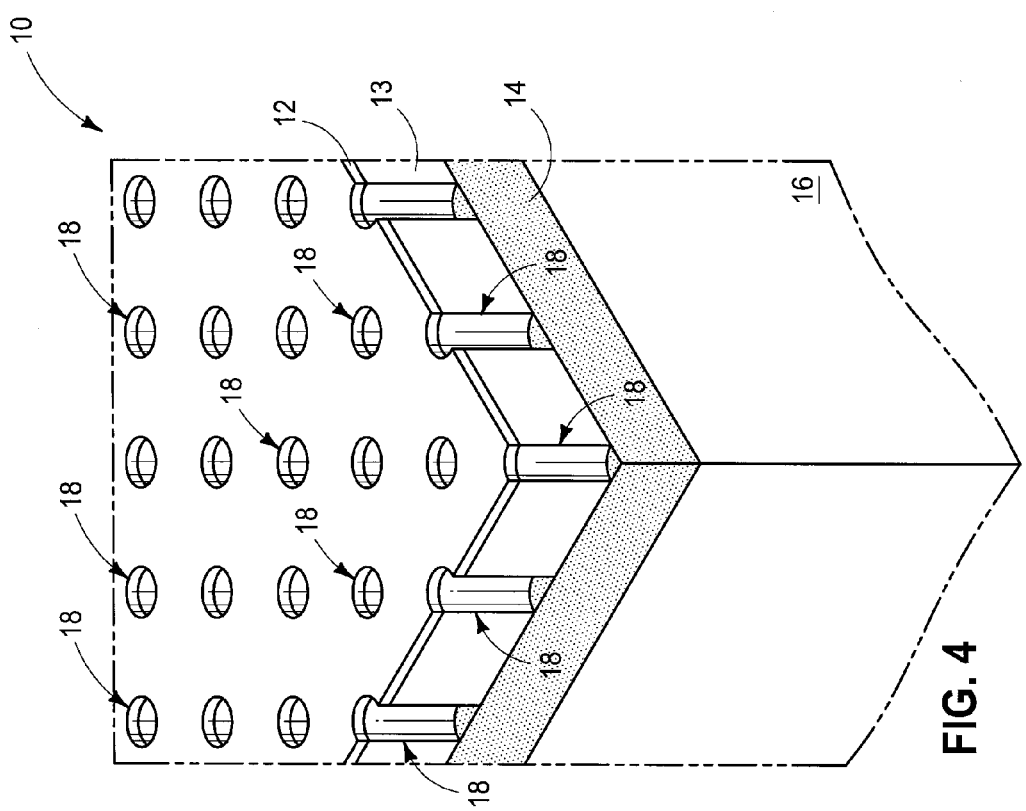

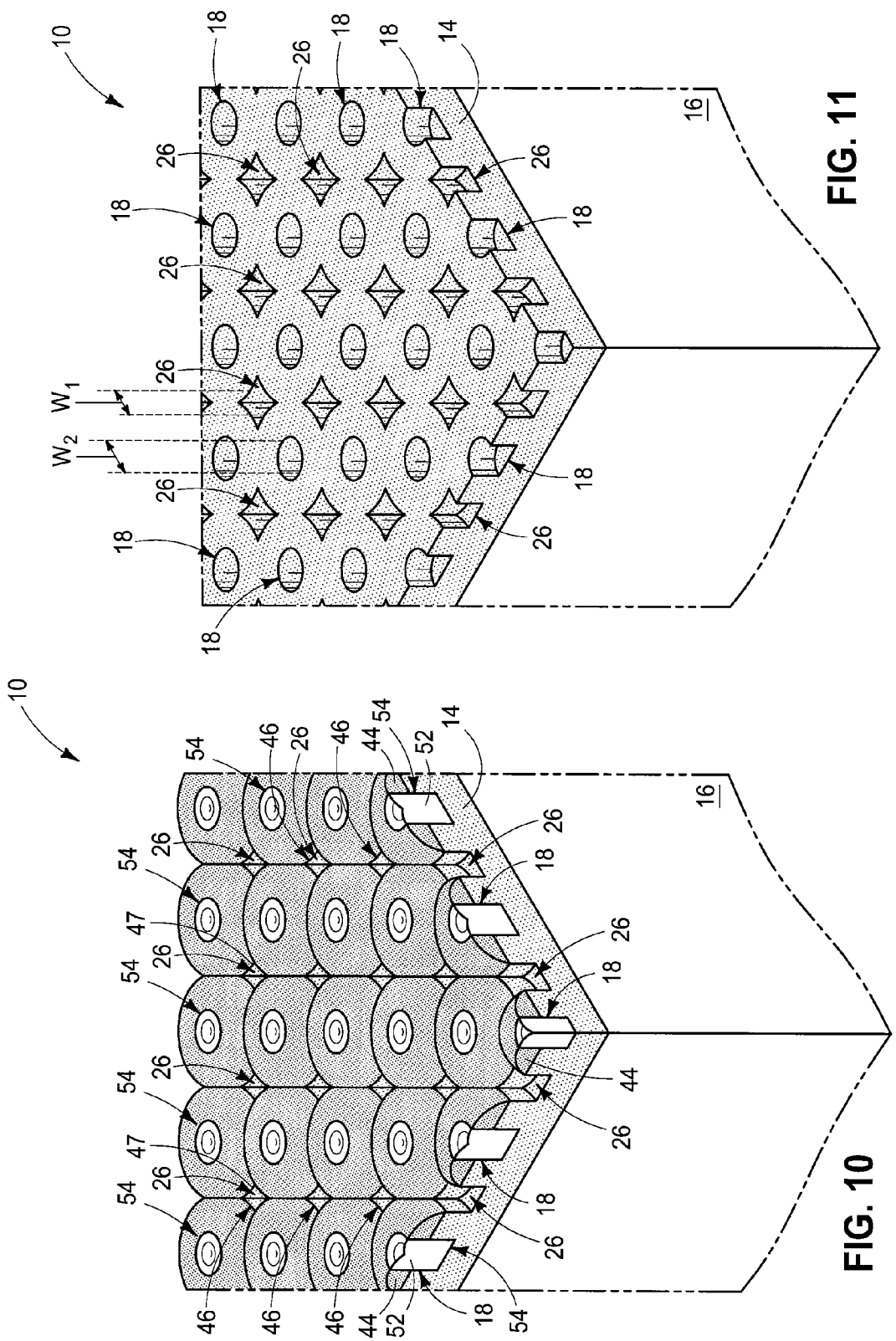

METHODS OF FORMING A PATTERN ON A SUBSTRATE

TECHNICAL FIELD

Embodiments disclosed herein pertain to methods of forming a pattern on a substrate.

BACKGROUND

Integrated circuits are often formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual electronic components, thereby enabling smaller and denser integrated circuitry.

One technique for patterning and processing semiconductor substrates is photolithography. Such may include deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form those features. For example, photolithography is commonly used to form patterned features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such techniques where pitch is actually halved, the reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed be uniform in dimension. Accordingly, uniformity when forming a plurality of features may also be of concern, and is increasingly a challenge as the minimum feature dimensions reduce.

BRIEF DESCRIPTION OF THE DRAWINGS

FIG. 4 is a view of the FIG. 3 substrate at a processing step subsequent to that shown by FIG. 3.

FIG. 5 is a view of the FIG. 4 substrate at a processing step subsequent to that shown by FIG. 4.

FIG. 10 is a view of the FIG. 9 substrate at a processing step subsequent to that shown by FIG. 9.

FIG. 11 is a view of the FIG. 10 substrate at a processing step subsequent to that shown by FIG. 10.

DETAILED DESCRIPTION OF EXAMPLE EMBODIMENTS

Figure 1:
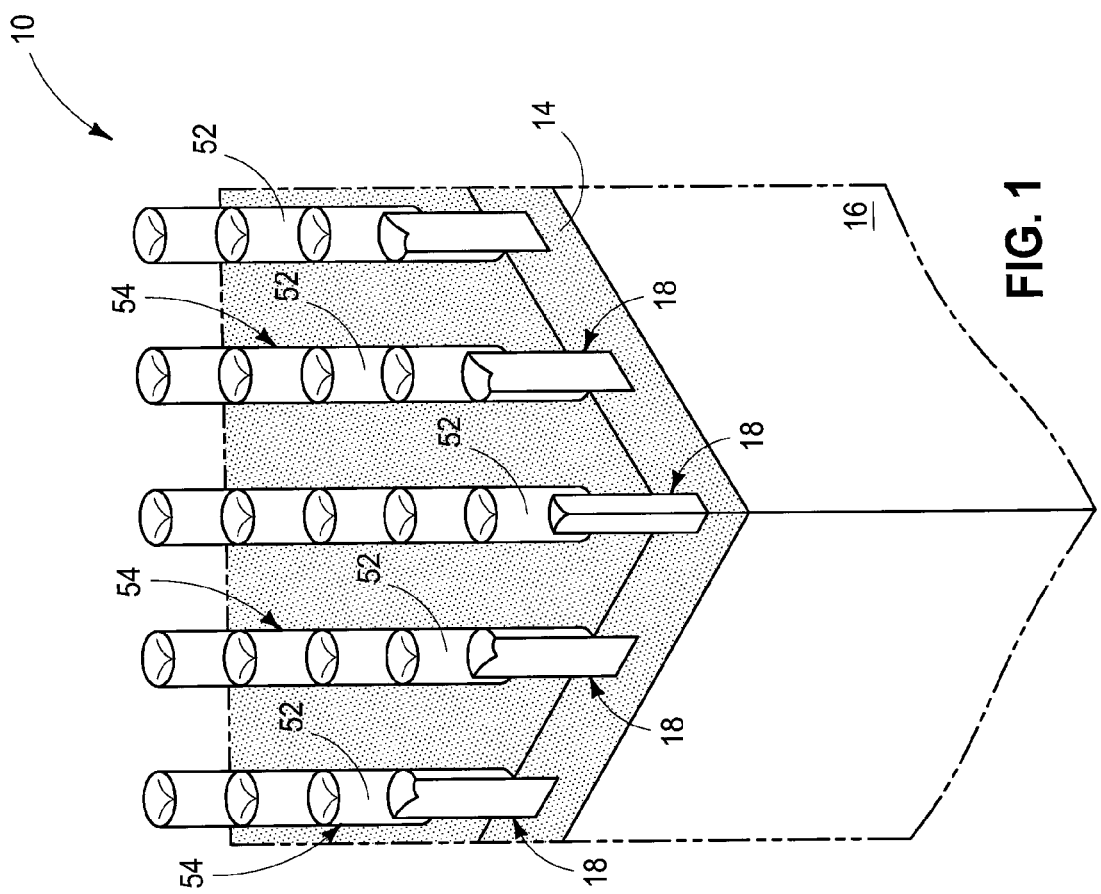
FIG. 1 is a diagrammatic isometric view of a substrate in process in accordance with an embodiment of the invention.

Example embodiments of methods of forming a pattern on a substrate in accordance with the invention are described with reference to FIGS. 1-13. Referring to FIG. 1, a substrate fragment 10 includes second material 14 that is elevationally outward of a substrate material 16. Substrate fragment 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Any of the materials and/or structures described herein may be homogenous or non-homogenous. Further, each may be formed using any suitable existing or yet-to-be-developed technique (with or without plasma), with atomic layer deposition, chemical vapor deposition, and physical vapor deposition being examples.

Second material 14 is of different composition from that of substrate material 16. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. As examples, second material 14 may comprise antireflective coating and/or hard-masking material such as $SiO_xN_y$, and substrate material 16 may comprise carbon, for example an elevationally outer portion comprising diamond-like carbon and an elevationally inner portion comprising amorphous hard-mask carbon. Substrate material 16 may comprise doped or undoped silicon dioxide elevationally inward of carbon-containing material, and independent of presence of carbon-containing material. Regardless, substrate material 16, in one example, may be that portion of substrate fragment 10 in which a pattern may be formed from processing relative to second material 14. Alternately, a pattern may be formed in accordance with some embodiments of the invention with respect to one or more materials that are elevationally outward of substrate material 16 independent of subsequent processing, if any, relative to elevationally underlying substrate material 16.

First openings 18 have been formed in second material 14, and in one embodiment extend partially there-through. Spaced pillars 54 comprising first material 52 project elevationally outward of first openings 18. In one embodiment, first material-comprising pillars 54 project elevationally outward of second material 14 further than first openings 18 extend into second material 14. In one embodiment, first material 52 is of different composition from that of second material 14. An example first material 52 is silicon dioxide where second material 14 comprises an example $Si_xO_yN_z$. In one embodiment, pillars 54 are formed to be solid throughout. In one embodiment and as shown, pillars 54 are formed in an oblique lattice pattern, for example where first openings 18 were formed in an oblique lattice pattern.

Figure 2:
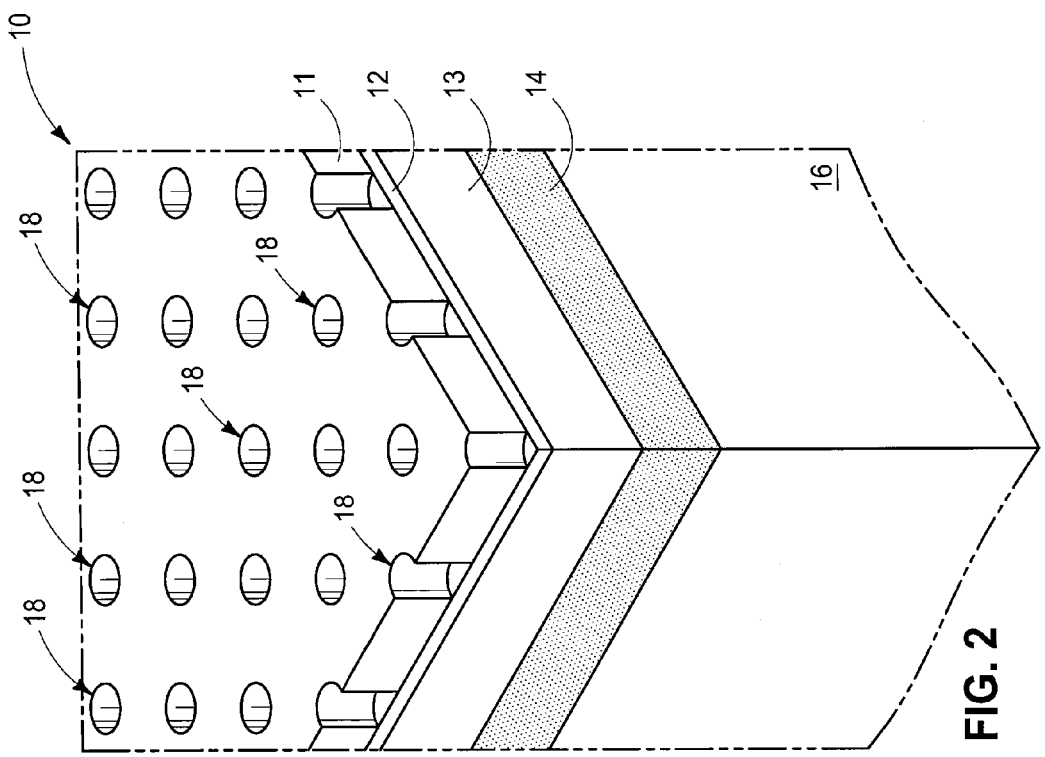
FIG. 2 is a view of a predecessor substrate that may be used in fabrication to form the FIG. 1 substrate.

The example FIG. 1 construction may be fabricated using any existing or later developed technique(s), for example including photolithographic patterning and etch. One example technique for doing so is described with respect to a predecessor substrate fragment 10 as shown in FIGS. 2-7. Referring to FIG. 2, an example hard-masking 13 (e.g., a carbon-containing material such as diamond-like carbon) is elevationally outward of second material 14. An antireflective coating and/or hard-masking material 12 (e.g., $SiO_xN_y$) of different composition from that of material 13 has been formed there-over. In one example, each of material 14 and material 12 comprises $SiO_xN_y$, and further for example with material 14 having greater silicon content than material 12 and material 12 having greater oxygen content than material 14. A masking material 11 (e.g., photoresist) has been formed elevationally outward of material 12, and an array of first openings 18 has been formed there-through. First openings 18 may be formed at a minimum-photolithographic-capable feature dimension. Alternately, first openings 18 may be formed at greater than a minimum-photolithographic-capable feature dimension, or may be formed to be sub-resolution (e.g., being sub-lithographic such as being formed using pitch multiplication techniques).

Figure 3:
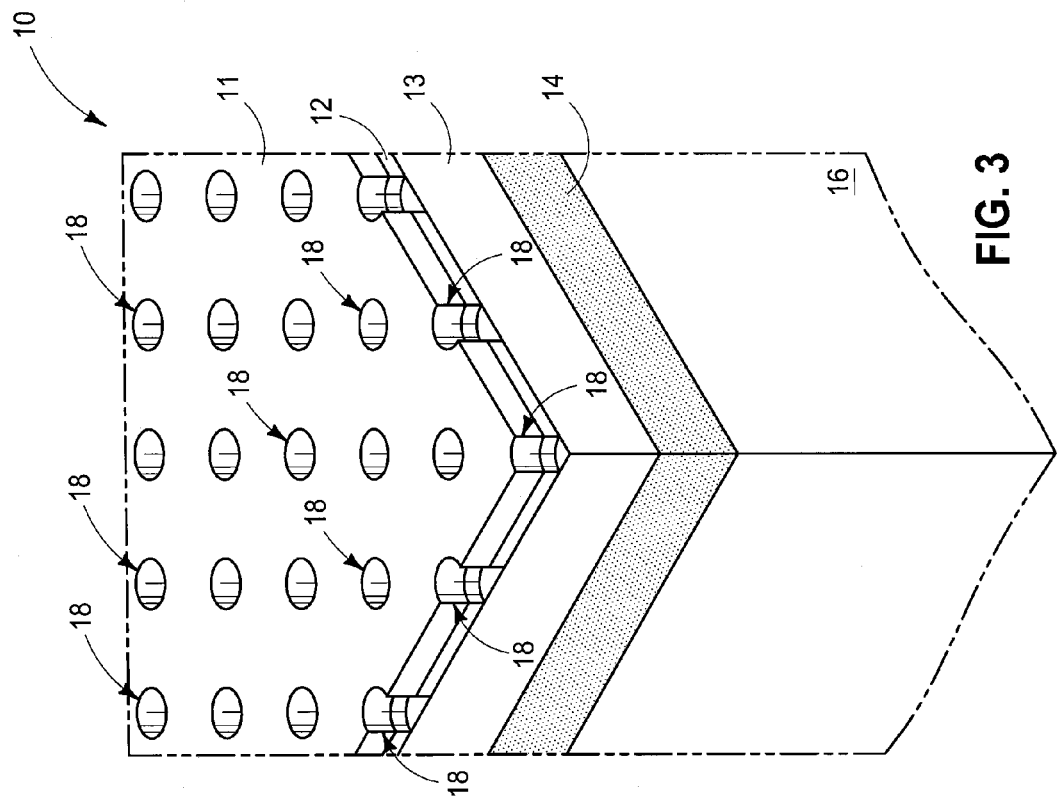
FIG. 3 is a view of the FIG. 2 substrate at a processing step subsequent to that shown by FIG. 2.

Referring to FIG. 3, masking material 11 has been used as a mask while etching first openings 18 through masking material 12. Thickness of material 11 may be reduced thereby, for example as shown.

Referring to FIG. 4, masking material 11 (not shown) has been removed, and first openings 18 as formed in masking material 12 have been etched through material 13 using material 12 as a mask. Thickness of material 12 may be reduced thereby, for example as shown. Masking material 11 may be removed prior to or during etching of masking material 12.

Referring to FIG. 5, masking material 12 (not shown) has been removed, and first openings 18 as formed in masking material 13 have been etched into second material 14 using material 13 as a mask. Thickness of material 13 may be reduced thereby (not shown). Masking material 12 may be removed prior to or during etching of masking material 13.

Figure 6:
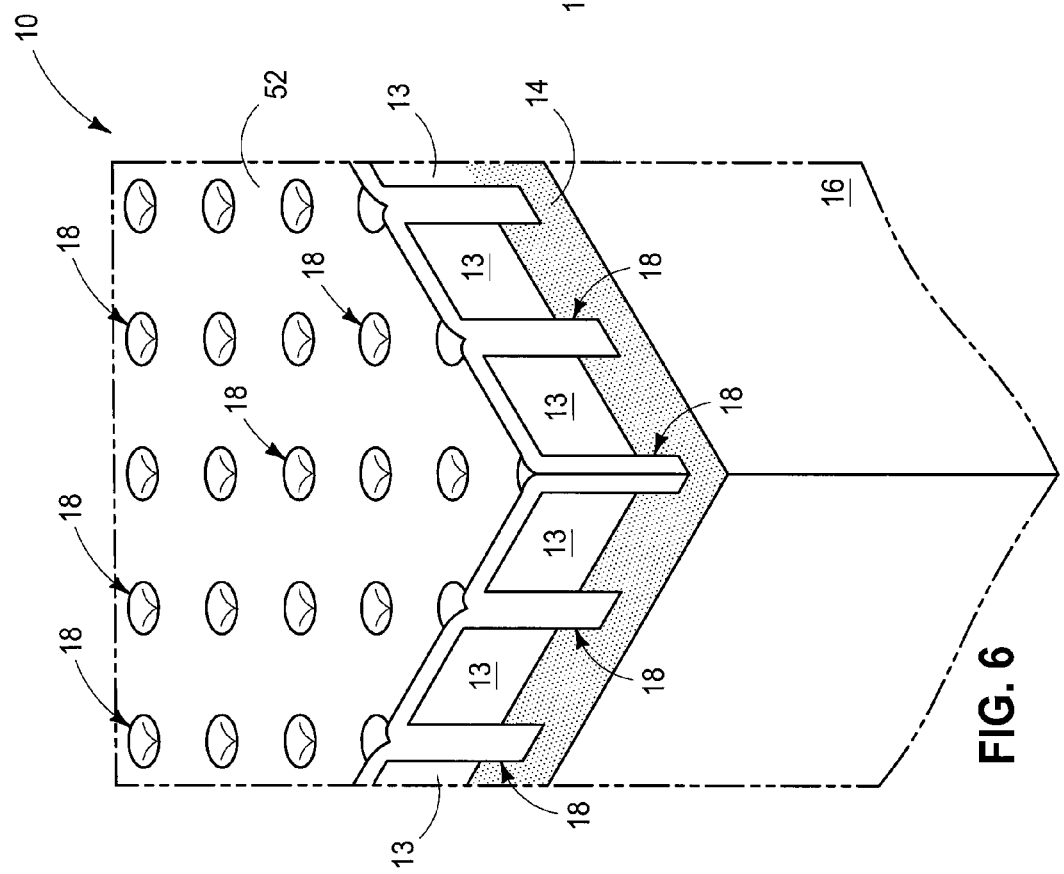
FIG. 6 is a view of the FIG. 5 substrate at a processing step subsequent to that shown by FIG. 5.

Referring to FIG. 6, first material 52 has been deposited to overfill first openings 18 in masking material 13 and first openings 18 in second material 14.

Figure 7:
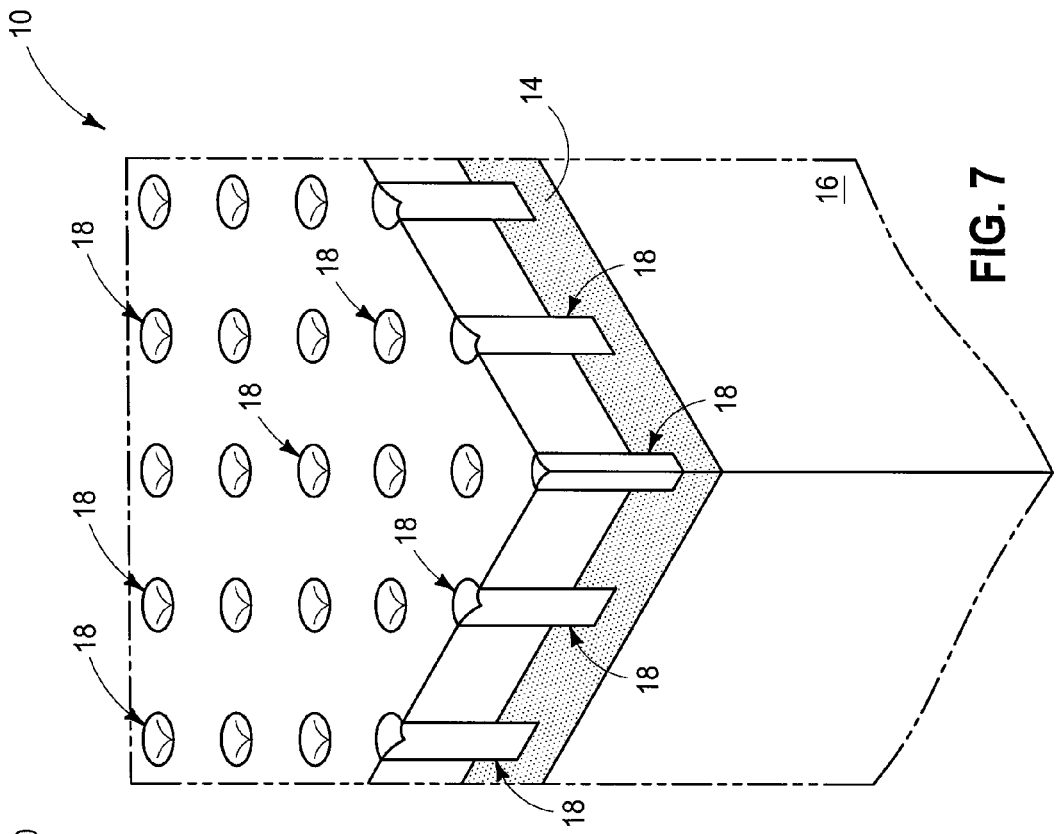
FIG. 7 is a view of the FIG. 6 substrate at a processing step subsequent to that shown by FIG. 6.

Referring to FIG. 7, material 52 has been planarized back at least to an elevationally outermost surface of masking material 13. Then, masking material 13 could be selectively etched relative to second material 14 and first material 52, thereby forming the FIG. 1 construction.

Alternate techniques may be used.

Sidewall spacers are formed over sidewalls of first material-comprising pillars 54. An example technique for doing so is described with reference to FIGS. 8 and 9.

Figure 8:
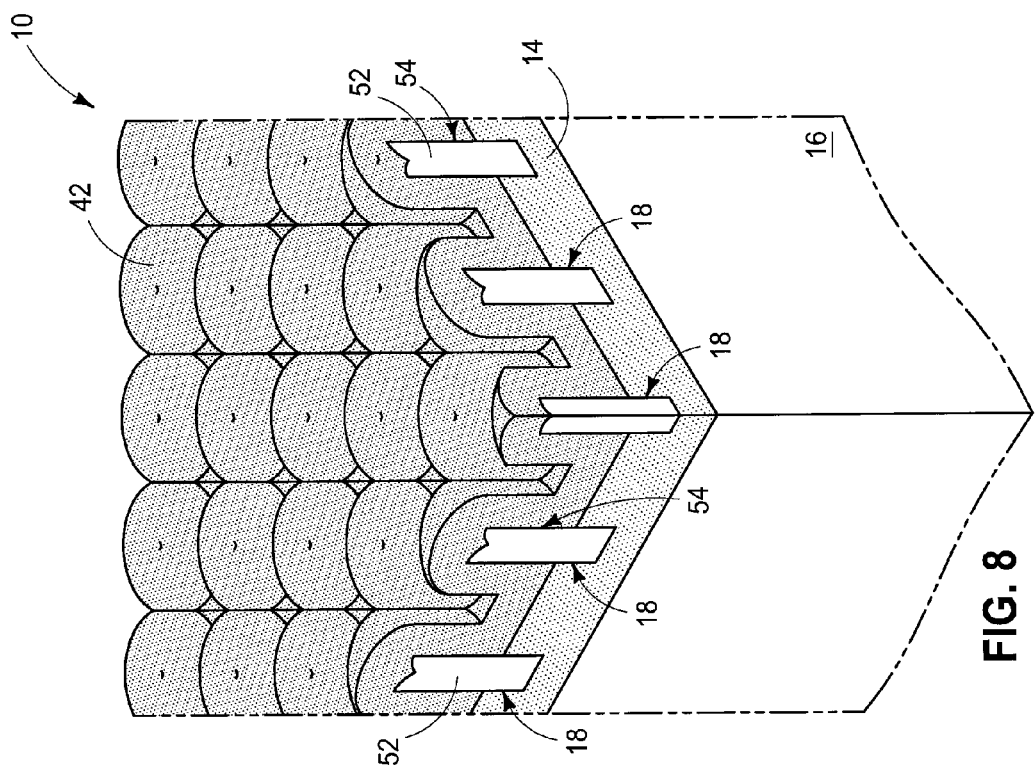
FIG. 8 is a view of the FIG. 1 substrate at a processing step subsequent to that shown by FIG. 1.

Referring to FIG. 8, a spacer-forming material 42 is formed over pillars 54.

Figure 9:
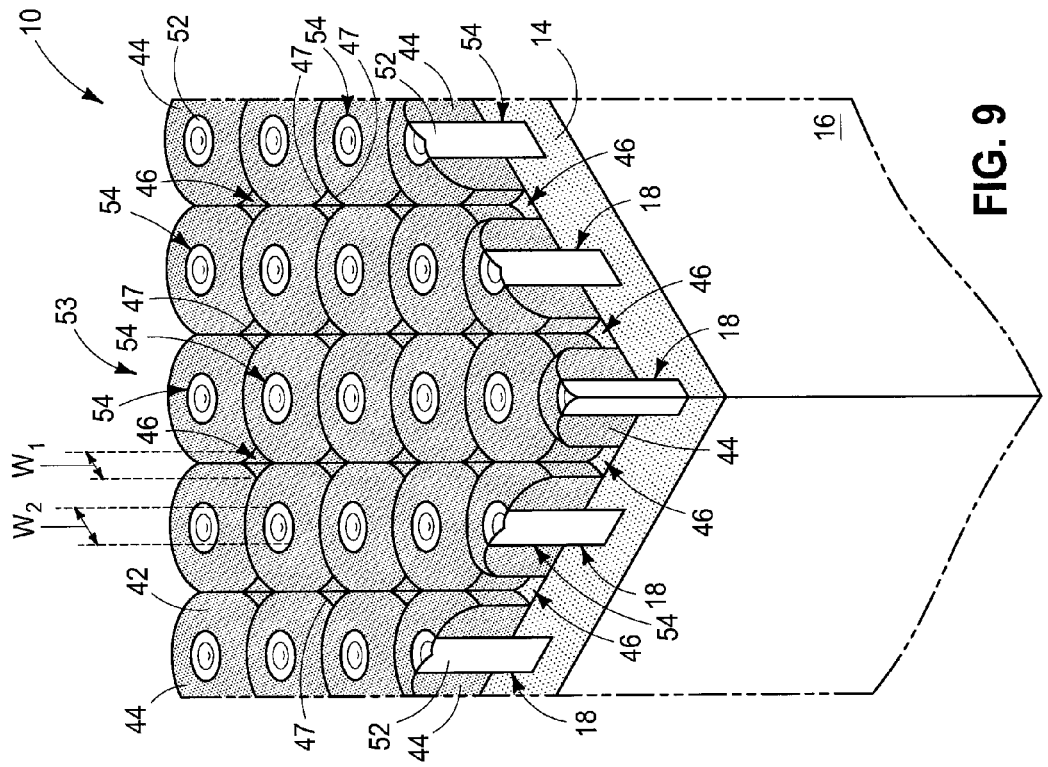
FIG. 9 is a view of the FIG. 8 substrate at a processing step subsequent to that shown by FIG. 8.

Referring to FIG. 9, spacer-forming material 42 has been anisotropically etched to form sidewall spacers 44 over pillars 54, and thereby a pattern 53. The sidewall spacers form interstitial spaces 46 laterally outward of pillars 54. Interstitial spaces 46 are individually surrounded by longitudinally-contacting sidewall spacers 44 that are over sidewalls of four pillars 54. In one embodiment, sidewall spacers 44 are of the same composition as that of first material 52. In one embodiment, sidewall spacers 44 are of different composition from that of second material 14.

FIGS. 1, 8, and 9 show but one example method of forming a pattern in accordance with an embodiment of the invention (e.g., a pattern 53) independent of subsequent processing that may occur. Broadly considered, a method in accordance with some embodiments of the invention includes forming spaced first material-comprising pillars projecting elevationally outward of first openings formed in second material independent of how those pillars are formed, and independent of whether the first and second materials are of the same or different composition(s) (e.g., pillars 54). Sidewall spacers are formed over sidewalls of the first material-comprising pillars independent of how those sidewalls spacers are formed (e.g., sidewall spacers 44). The sidewall spacers form interstitial spaces laterally outward of the first material-comprising pillars (e.g., interstitial spaces 46), and which are laterally surrounded by longitudinally-contacting sidewall spacers that are over sidewalls of four of the first material-comprising pillars. In one embodiment, the interstitial spaces are quadrilateral in cross-sectional shape having concave sidewalls (e.g., sidewalls 47), and in one embodiment are rectangular in cross-sectional shape. In one embodiment, the interstitial spaces have respective shorter minimum open dimensions at an elevationally outermost surface of the sidewall spacers (e.g., $W_1$ in FIG. 9) than minimum width of tops of the pillars (e.g., $W_2$). In one embodiment where the pillars are formed in an oblique lattice pattern, a combination of the pillars and the interstitial spaces form a square lattice pattern.

In one embodiment and as shown by way of example only in FIG. 10, sidewall spacers 44 and first material-comprising pillars 54 are used as a mask while forming second openings 26 into second material 14 through interstitial spaces 46. In one embodiment, second openings 26 extend only partially though second material 14. Elevational thickness of sidewall spacers 44 and pillars 54 may reduce in forming second openings 26, for example as shown.

Referring to FIG. 11, pillars 54 (not shown) and sidewall spacers 44 (not shown) have been removed to leave second material 14 comprising first openings 18 and second openings 26.

Figure 12:
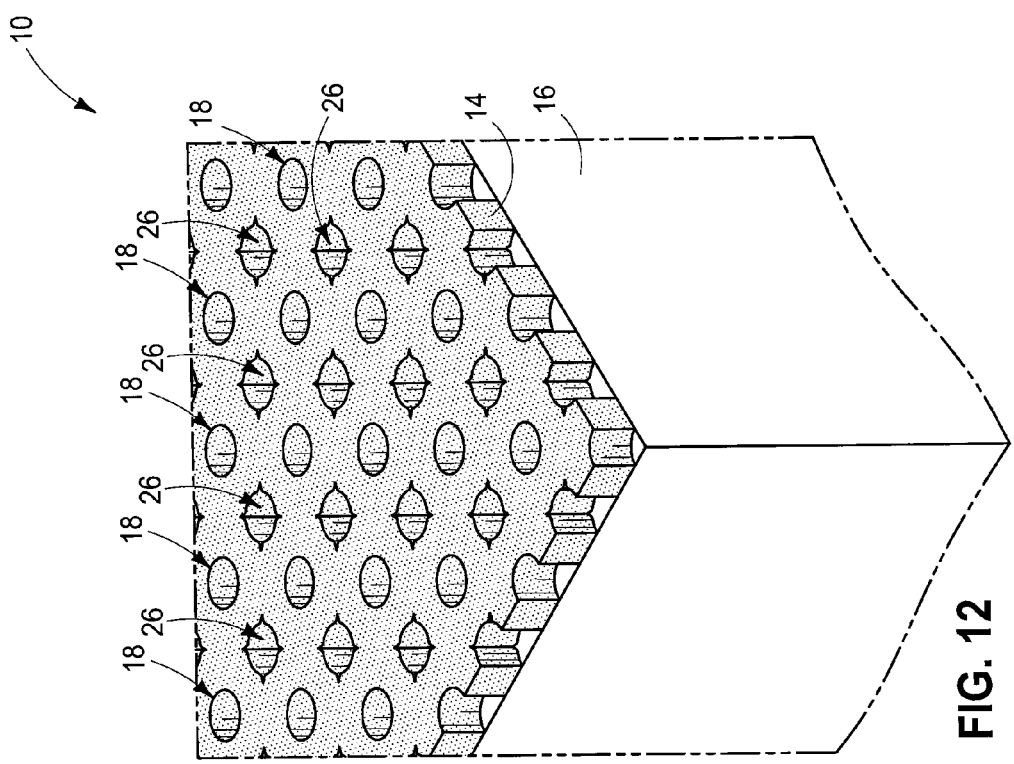
FIG. 12 is a view of the FIG. 11 substrate at a processing step subsequent to that shown by FIG. 11.

In one embodiment, for example as shown in FIG. 12, second material 14 is etched to extend first openings 18 and second openings 26 there-through. The processing may have a tendency to round-out openings 26, for example as shown.

Figure 13:
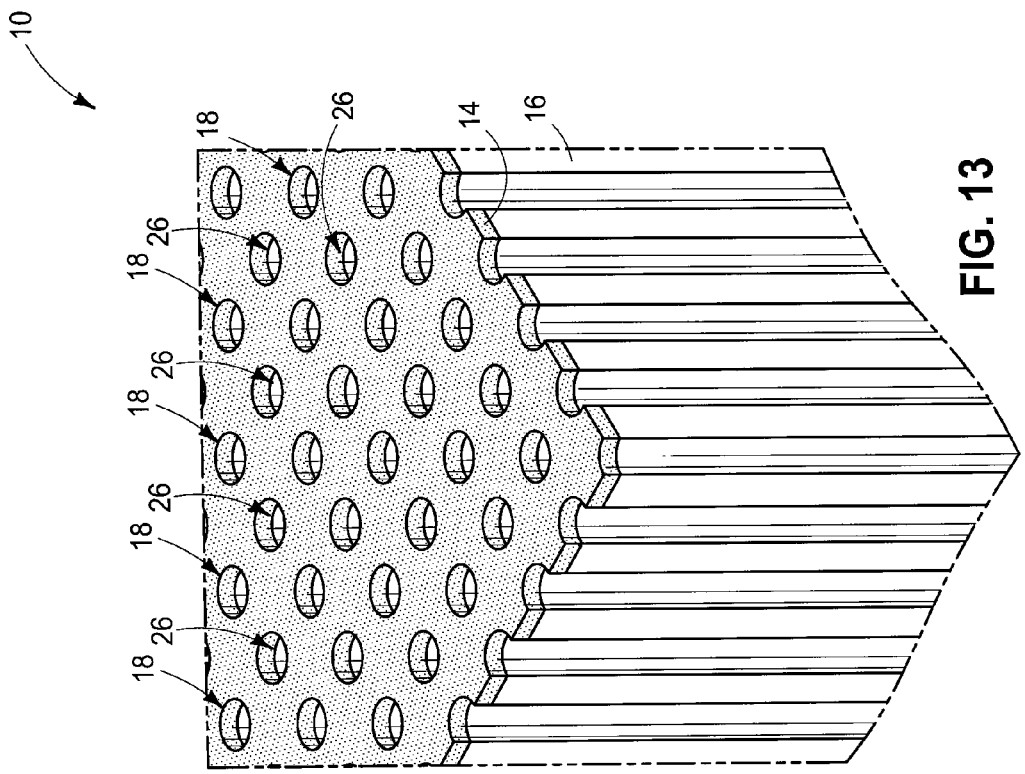
FIG. 13 is a view of the FIG. 12 substrate at a processing step subsequent to that shown by FIG. 12.

Second material 14 of FIGS. 11 and/or 12 may be used as a mask while processing substrate material beneath the second material through the first and second openings that are in the second material, for example as a mask for ion implanting, diffusion doping, or etching into underlying material. As an example, FIG. 13 shows example subsequent processing wherein second material 14 of FIG. 12 has been used as an etch mask while etching into substrate material 16 through first openings 18 and second openings 26. Elevational thickness of second material 14 may reduce by such processing, for example as shown. The openings formed in substrate material 16 may be used as contact openings, capacitor electrode openings, and/or for forming programmable portions of two-electrode memory cells, by way of examples only. Second material 14 may remain as part of a finished construction, or may be wholly or partly removed.

CONCLUSION

In some embodiments, a method of forming a pattern on a substrate comprises forming spaced first material-comprising pillars projecting elevationally outward of first openings formed in second material. Sidewall spacers are formed over sidewalls of the first material-comprising pillars. The sidewall spacers form interstitial spaces laterally outward of the first material-comprising pillars. The interstitial spaces are individually surrounded by longitudinally-contacting sidewall spacers that are over sidewalls of four of the first material-comprising pillars.

In some embodiments, a method of forming a pattern on a substrate comprises forming spaced first material-comprising pillars projecting elevationally outward of first openings formed in second material. The second material is of different composition from that of the first material. Third material is elevationally inward of the second material and is of different composition from that of the second material. The first openings extend only partially through the second material. Sidewall spacers are formed over sidewalls of the first material-comprising pillars. The sidewall spacers form interstitial spaces laterally outward of the first material-comprising pillars. The interstitial spaces are individually surrounded by longitudinally-contacting sidewall spacers that are over sidewalls of four of the first material-comprising pillars. The sidewall spacers are of different composition from that of the second material. The sidewall spacers and the first material-comprising pillars are used as a mask while forming second openings into the second material through the interstitial spaces. The second openings extend only partially through the second material. The first material-comprising pillars and the sidewall spacers are removed to leave second material comprising the first and second openings. After the removing of the first material-comprising pillars and the sidewall spacers, the second material is etched to extend the first and second openings there-through. The second material having the first and second openings extending there-through is used as an etch mask while etching into the third material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming second material over a substrate;
    forming first openings into the second material;
    after forming the second material and first openings, forming spaced first material-comprising pillars projecting elevationally outward of first of the first openings formed in the second material; and
    forming sidewall spacers over sidewalls of the first material-comprising pillars, the sidewall spacers forming interstitial spaces laterally outward of the first material-comprising pillars, the interstitial spaces being individually surrounded by longitudinally-contacting sidewall spacers that are over sidewalls of four of the first material-comprising pillars.

2. The method of claim 1 wherein the second material is of different composition from that of the first material.

3. The method of claim 1 wherein the sidewall spacers are of different composition from that of the second material.

4. The method of claim 1 wherein the sidewall spacers are of the same composition as that of the first material.

5. The method of claim 4 wherein the sidewall spacers are of different composition from that of the second material.

6. The method of claim 1 wherein the first material-comprising pillars project elevationally outward of the second material further than the first openings extend into the second material.

7. The method of claim 1 comprising third material elevationally inward of the second material, the third material being of different composition from that of the second material, the first openings extending only partially through the second material.

8. The method of claim 1 further comprising:
    using the sidewall spacers and the first material-comprising pillars as a mask while forming second openings into the second material through the interstitial spaces.

9. The method of claim 8 further comprising:
    removing the first material-comprising pillars and the sidewall spacers to leave second material comprising the first and second openings.

10. The method of claim 9 comprising third material elevationally inward of the second material, the third material being of different composition from that of the second material, the first and second openings extending only partially through the second material before and after the removing of the first material-comprising pillars and the sidewall spacers; and further comprising:
    after the removing of the first material-comprising pillars and the sidewall spacers, etching the second material to extend the first and second openings there-through.

11. The method of claim 10 using the second material having the first and second openings extending there-through as a mask while processing the third material through the first and second openings.

12. The method of claim 11 wherein the processing comprises etching the third material through the first and second openings.

13. The method of claim 1 wherein the interstitial spaces are individually of quadrilateral cross-sectional shape with concave sidewalls.

14. The method of claim 13 wherein the interstitial spaces are individually of rectangular cross-sectional shape.

15. The method of claim 1 comprising forming the pillars to be solid throughout.

16. The method of claim 1 comprising forming the pillars in an oblique lattice pattern and forming a combination of the pillars and the interstitial spaces in a square lattice pattern.

17. The method of claim 1 wherein the interstitial spaces have respective shorter minimum open dimensions at an elevationally outermost surface of the sidewall spacers than minimum width of tops of the pillars.

18. A method of forming a pattern on a substrate, comprising:
    forming second material over a substrate;
    forming first openings into the second material;
    after forming the second material and first openings, forming spaced first material-comprising pillars projecting elevationally outward of the first openings formed in the second material, the second material being of different composition from that of the first material, third material elevationally inward of the second material and being of different composition from that of the second material, the first openings extending only partially through the second material;
    forming sidewall spacers over sidewalls of the first material-comprising pillars, the sidewall spacers forming interstitial spaces laterally outward of the first material-comprising pillars, the interstitial spaces being individually surrounded by longitudinally-contacting sidewall spacers that are over sidewalls of four of the first material-comprising pillars, the sidewall spacers being of different composition from that of the second material;
    using the sidewall spacers and the first material-comprising pillars as a mask while forming second openings into the second material through the interstitial spaces, the second openings extending only partially through the second material;
    removing the first material-comprising pillars and the sidewall spacers to leave second material comprising the first and second openings;
    after the removing of the first material-comprising pillars and the sidewall spacers, etching the second material to extend the first and second openings there-through; and
    using the second material having the first and second openings extending there-through as a mask while processing the third material through the first and second openings.

19. The method of claim 18 wherein the processing comprises etching the third material through the first and second openings.

20. The method of claim wherein 10 wherein the first openings are of a first horizontal cross sectional shape prior to the etching, the second openings being of a second horizontal cross sectional shape prior to the etching that is different from the first horizontal cross sectional shape, the etching changing the second horizontal cross-sectional shape of the second openings.

21. The method of claim 20 wherein the etching does not change the first horizontal cross-sectional shape of the first openings.

22. The method of claim 20 wherein prior to the etching the second openings comprise four concave sidewall portions, the etching forming the second openings to comprise four convex sidewall portions.

23. A method of forming a pattern on a substrate, comprising:
    forming first and second openings into a substrate, the first and second openings forming a square lattice pattern and alternating relative one another along rows and columns in the square lattice pattern, the first openings being of a first horizontal cross sectional shape, the second openings being of a second horizontal cross sectional shape that is different from the first horizontal cross sectional shape; and
    etching the first and second openings deeper into the substrate, the etching changing the second horizontal cross-sectional shape of the second openings.

24. The method of claim 23 comprising forming the first and second openings at different times prior to said etching.

25. The method of claim 24 comprising forming the first openings prior to said etching before forming the second openings prior to said etching.

26. The method of claim 23 wherein the etching does not change the first horizontal cross-sectional shape of the first openings.

27. The method of claim 26 wherein prior to the etching the second openings comprise four concave sidewall portions, the etching forming the second openings to comprise four convex sidewall portions.

* * * * *